United States Patent [19]
Oehler

[11] 4,095,282
[45] June 13, 1978

[54] MEMORY INCLUDING VARACTOR CIRCUIT TO BOOST ADDRESS SIGNALS

[75] Inventor: Harry G. Oehler, Glen Burnie, Md.

[73] Assignee: Westinghouse Electric Corp., Pittsburgh, Pa.

[21] Appl. No.: 744,377

[22] Filed: Nov. 23, 1976

[51] Int. Cl.² .................................. G11C 11/40
[52] U.S. Cl. .......................... 365/204; 365/180; 365/189
[58] Field of Search ..... 340/173 R, 173 CA, 173 FF; 307/238, 279

[56] References Cited
U.S. PATENT DOCUMENTS
4,027,294  5/1977  Meusburger .................... 340/173 R Primary Examiner—Terrell W. Fears
Attorney, Agent, or Firm—J. B. Hinson

[57] ABSTRACT

A nonvolatile (MNOS) memory array using varactor boosted select signals is disclosed. The memory utilizes a varactor circuit to boost the row select during the erase and write modes of operation.

3 Claims, 4 Drawing Figures

MEMORY INCLUDING VARACTOR CIRCUIT TO BOOST ADDRESS SIGNALS

STATEMENT OF GOVERNMENT INTEREST

The invention herein described was made in the course of or under contract No. DAAB 07-73-C-0160 with the Department of the Army.

BACKGROUND OF THE INVENTION

1. Field of the Invention

The invention relates to memories, and more particularly to arrays of MNOS memory circuits utilizing a varactor bootstrap circuit to boost the row select signals during erase and write operations.

2. Description of the Prior Art

Typical prior art solid state MNOS memory arrays require that the select voltage coupled to the gate of the transistors comprising the array have a higher value during the clear and erase operations than during the interrogate operations. In prior art MNOS memory arrays this has resulted in the output transistors of the address decoders having a relatively high voltage drop between the drain and source. This increased the power consumption because of the high voltage drop across these transistors and reduced the amplitude of the select signals. The net result was high power consumption and impaired memory operation.

SUMMARY OF THE INVENTION

The circuit which is the subject of this invention provides a decode circuit which generates a low voltage select signal for the interrogate operations and utilizes a varactor boost circuit for boosting the output of the decoder during erase and write operations. During the interrogate operation this circuit functions very similar to the prior art circuit with the resulting low power consumption. The varactor boost circuit includes a varactor coupled to the decoder output. In the write or erase modes, the output of the decoder charges the varactor. Following charging of the varactor, a voltage pulse is coupled to the varactor to boost the output voltage of the decoder. In the preferred embodiment a sample and hold circuit is utilized to isolate the varactor from the driver except when it is being charged. The additional voltage to boost the output of the decoder is provided by a transistor which is not conducted during interrogate operations. This increases the select voltage improving memory operation and reduces power consumption.

DETAILED DESCRIPTION

Figure 1:
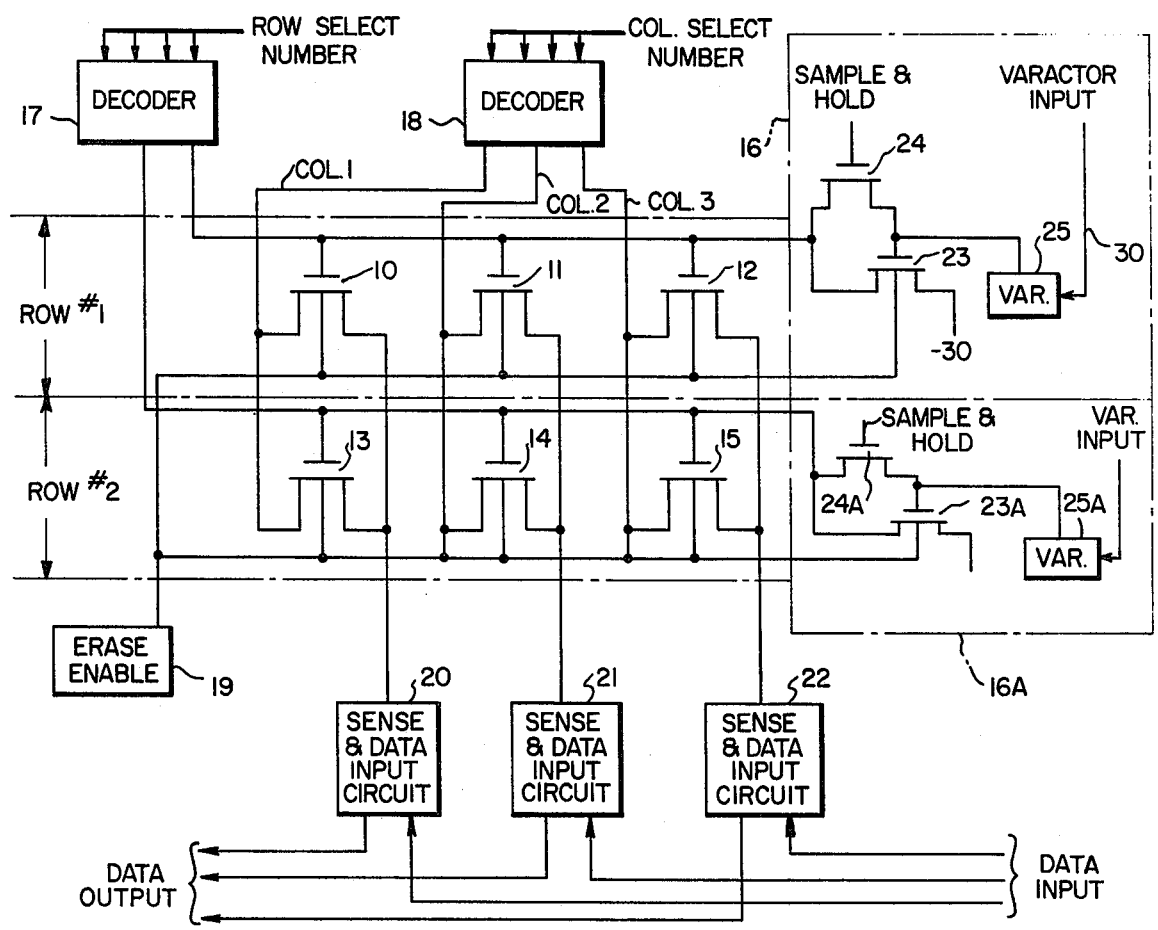
FIG. 1 is a block diagram of the memory which is the subject of this invention.

FIG. 1 is a block diagram of a memory system utilizing a varactor booster to boost the row select signal during erase and write operations. The system illustrated in FIG. 1 includes two rows of memory transistors with the transistors of the first row being illustrated at reference numerals 10 through 12 and the members of the second row being illustrated at references numerals 13 through 15. The memory transistors comprising the array may be conventional prior art devices. Therefore the voltage levels needed to control these devices and their structural features will not be described in detail.

The voltage to the gates of the memory transistors, although conventional in function, is controlled by a row decoder circuit 17 and a novel varactor boost circuit 16. Correspondingly, the column select signals for the array are provided by a conventional column decoder circuit 18 to enable specific transistors of the array. In the erase mode, the voltage to the substrate of the memory transistors is conventionally controlled by an erase circuit 18. During the interrogate cycle, the state of the enabled transistor of the array is detected by a conventional sense and data input circuit 20. In the write mode data to indicate the desired level of the associated transistor is also provided through the sense and data input circuit 20. A sense and data circuit is provided for each column of the array. Additional sense circuits identical to circuit 20 are illustrated for the other rows of the array at reference numerals 21 and 22.

Each of the row select signals are coupled to a varactor boost circuit for boosting the output signals of row decoder circuit 17 during the erase and write operations. The boost circuit for row number 1 is illustrated at reference numeral 16. The row select signal for row number 1 is coupled to the source of a driver transistor. The driver transistor for row number 1 is illustrated at reference numeral 23. The drain of this transistor is coupled to a −30 volts power supply. A sample and hold transistor 24 is coupled between the row select line for row number 1 and the gate of driver transistor 23. Additionally, a varactor diode 25 is coupled to the gate of the driver transistor 23.

The varactor boost circuit for row number 2 is illustrated at reference numeral 16A. Components of this circuit corresponding to the components of the varactor boost circuit for row number 1 are identified by same reference numerals followed by the letter "A". For example, the driver transistor for the varactor boost circuit for row number 1 is identified by reference numeral 23. The corresponding driver transistor for the varactor boost circuit for row 2 is identified by reference numeral 23A.

The array of memory transistors as well as the decoder and sense circuits discussed above with reference to FIG. 1 may be conventional, as discussed above, and may be constructed using well known techniques. The varactor illustrated at reference numeral 25 may also be constructed using well known techniques; however, for purposes of clarity, a cross-section of the varactor is illustrated in detail in FIG. 2.

In the preferred embodiment the varactor utilizes an n-conductivity type substrate 26. Within this substrate is a p-conductivity type region 27 is formed utilizing conventional semiconductor processes. Overlying the upper surface of the substrate 26 is a thin insulating layer 28. Overlying a portion of the thin insulating layer 28 is a conductive layer 29, aluminum for example. Insulating layer 28 also includes an opening through which a second conductive layer 30 makes electrical contact with the p-region 27. Conductive layers 29 and 30 form the inputs to the varactor.

Figure 2:
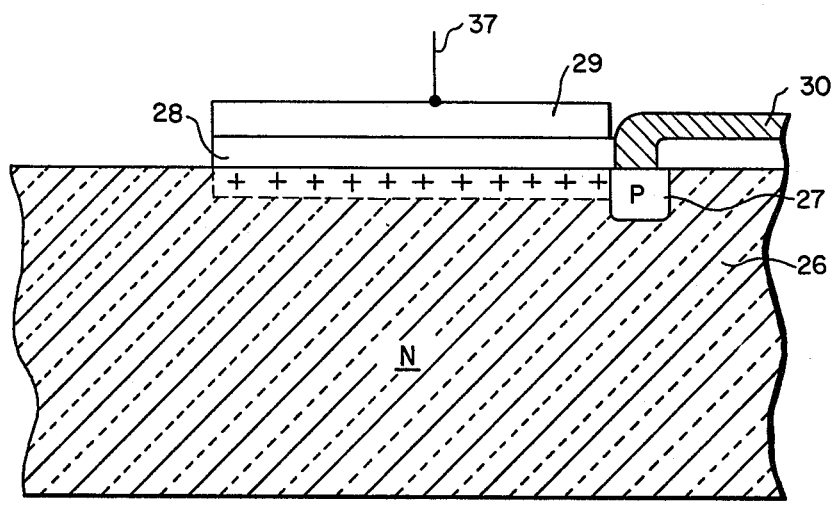
FIG. 2 is a cross-section of the varactor used in the boost circuit.
Figure 3:
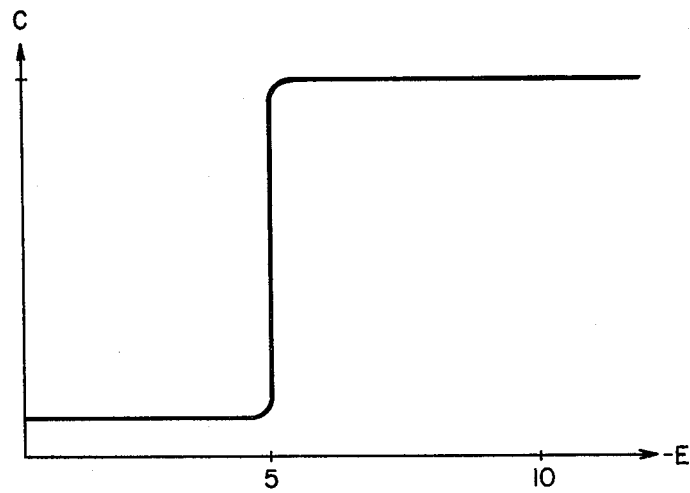
FIG. 3 is a capacitance versus voltage curve for the varactor illustrated in FIG. 2.

FIG. 3 is a voltage versus capacitance curve for a varactor of the type illustrated in FIG. 2. Initially, that is when the voltage between the terminals of the varactor is very low, the capacitance is quite low. This capacitance is due primarily to the direct coupling between the p-region 27 and the top electrode 29. As the voltage between the terminals of the varactor begins to increase with the top electrode 29 being negative with respect to the p-region 27, a depletion region as shown by positive charges in FIG. 2 begins to form beneath the top electrode 29. This region is formed by the attraction of the positive charges by the negative voltage coupled to the terminal. Eventually, the high concentration of plus charges reduces the electrical resistance of the substrate in a region near the surface and underlying the top electrode 29. At this point, the capacitance between the two electrodes increases very rapidly as indicated in FIG. 3. Using easily achievable thicknesses for the insulating layer 28, the high capacitance region can begin at approximately 5 volts as indicated in FIG. 3. Once this region begins to form, the capacitance increases to a value indicated by C in FIG. 3 with the capacitor being charged to the voltage coupled between its two terminals.

Figure 4:
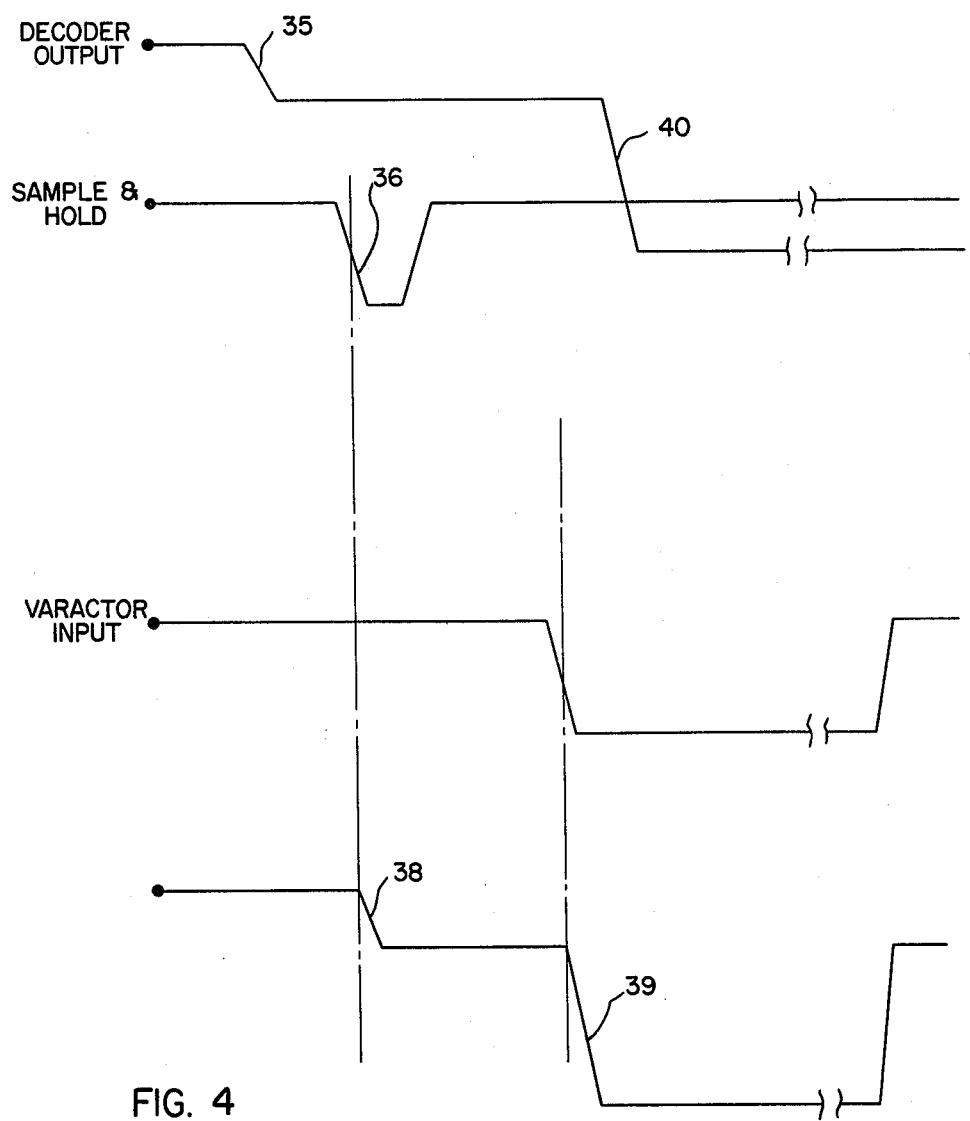
FIG. 4 is a waveform diagram illustrating the operation of the decoder illustrated in FIG. 1.

FIG. 4 is a waveform diagram which will be utilized in conjunction with FIGS. 1, 2 and 3 to explain in detail the operation of the varactor boost circuit and the memory array. As previously explained, the varactor booster is operative only in the erase or write modes. In operation, a number specifying the memory transistor of the array to be written into or erased is coupled to the row decoder 17 and the column decoder 18. The sense and data input circuits and the erase enable circuit 19 are initialized as appropriate. This generates a row select signal at the output of row decoder 17 and a column select signal at the output of column decoder circuit 18 and appropriate control signals to the memory transistor. The transistor associated with the intersection of the row and column select signals will be enabled. For example, assuming that the input to the decoders is such that the first column and the second row is selected, memory transistor 11 will be enabled. Under these conditions, the output signal of the row decoder 18 which enables column number 2 will go to approximately −10 volts. Simultaneously, the output signal of row decoder 17 which enables row number 1 will change from approximately zero volts to −10 volts DC as indicated at reference numeral 35 in FIG. 4. (The output signal of the column decoder 18 is not illustrated because the operation of this circuit is conventional in every respect). At this point, both the row and column select signals are approximately −10 volts. Following switching of the output signal of the row decoder 17 to −10 volts, a −10 volt sample and hold pulse is coupled to the gate terminal of sample and hold transistor 24. This signal is indicated at reference numeral 36 of FIG. 2. The −10 volt signal coupled to the gate of sample and hold transistor 24 causes the gate terminal of driver transistor 23 and the voltage to the input terminal 37 of varactor 25 to be switched to approximately −10 volts. This transition causes charges to be stored in varactor 25 and is illustrated at reference numeral 38 of FIG. 4. The amplitude of the sample and hold signal is then switched back to zero volts DC, disabling sample and hold transistor 34 and isolating the gate of driver transistor 23 from the row select signal.

Following disabling of the sample and hold circuit, the input terminal 30 of varactor 25 is switched from approximately 0 volts to −25 volts. Substantially all of the charge stored in varactor 25 is coupled directly to the gate of driver transistor 23. This transition is indicated at reference numeral 39 in FIG. 4 and is sufficient to exceed the threshold of driver transistor 23 and couple substantially all of the −30 volts coupled to the drain of this transistor to the source with a very low power loss. This causes the row select line to decrease to approximately −30 volts as indicated at reference numeral 40 of FIG. 3. Boosting the output signal of row decoder circuit 17 will normally turn off the output stage of this circuit because the output stage is normally a source follower circuit. This prevents interaction between the varactor booster circuit and the decoder. The input signal to the varactor is then returned to a steady state value of approximately zero volts and the next cycle of the memory can be started.

Although the operation of the bootstrap circuit was described above with reference to row 1, a similar circuit is included for each row of a memory array. Additionally, the bootstrap circuit is utilized only when the state of the address memory transistor is to be changed, either by erasing or writing. In the read mode the sample and hold gate signal is not generated, nor is the input signal to the varactor thus permitting transistors of the array to be conventionally interrogated. This totally disables the driver transistor 30 and limits the voltage to the row select to approximately −10 volts. The inputs to the sample and hold transistors as well as the varactor input terminals of the booster circuits may be connected in common. It is also possible to couple the varactor directly to the output signals of decoder circuit 17. However, under some circumstances this causes undesirable loading effects.

Only three columns and two rows of memory transistors are illustrated in FIG. 1. However, any desired number of rows and columns can be used.

I claim:
1. An MNOS memory array comprising:
 a. an array of MNOS memory transistors, said array being arranged in columns and rows;
 b. first addressing means responsive to a first digital signal to generate a column select signal;
 c. second addressing means responsive to a second digital signal to generate a row select signal; and
 d. varactor means responsive to said row select signal and a write mode signal to boost said row select signal when said memory is in the write mode.
2. An MNOS memory array comprising:
 a. an array of MNOS memory transistors, said array being arranged in columns and rows;
 b. first addressing means responsive to a first digital signal to generate a column select signal;
 c. second addressing means responsive to a second digital signal to generate a row select signal; and
 d. varactor means responsive to said row select signal and an erase mode signal to boost said row select signal when said memory is in the erase mode.
3. An MNOS memory system comprising:
 a. an array of MNOS memory transistor arranged in rows and columns;
 b. first addressing means responsive to a first digital number to generate a column select signal;
 c. second addressing means responsive to a second digital number to generate a select signal;
 d. source follower circuit means for coupling said select signal to said array and to a varactor boost circuit to store charges in said varactor; and
 e. means for coupling a mode signal to said varactor to generate a row select signal at the output of said source follower circuit means, said row select signal having an amplitude and polarity sufficient to turn off the output stage of said source follower means thereby isolating said select signal from said source follower means.

* * * * *